United States Patent
Hsu et al.

(10) Patent No.: US 7,276,392 B2
(45) Date of Patent: Oct. 2, 2007

(54) FLOATING BODY GERMANIUM PHOTOTRANSISTOR WITH PHOTO ABSORPTION THRESHOLD BIAS REGION

(75) Inventors: Sheng Teng Hsu, Camas, WA (US); Jong-Jan Lee, Camas, WA (US); Jer-Shen Maa, Vancouver, WA (US); Douglas J. Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 134 days.

(21) Appl. No.: 11/261,191

(22) Filed: Oct. 28, 2005

(65) Prior Publication Data

US 2007/0004067 A1    Jan. 4, 2007

Related U.S. Application Data

(63) Continuation-in-part of application No. 11/174,035, filed on Jul. 1, 2005.

(51) Int. Cl.
*H01L 21/00* (2006.01)
*H01L 21/84* (2006.01)
*H01L 21/20* (2006.01)
*H01L 21/36* (2006.01)

(52) U.S. Cl. .................. 438/48; 438/149; 438/479
(58) Field of Classification Search .................. 438/48, 438/149–152, 479
See application file for complete search history.

(56) References Cited

U.S. PATENT DOCUMENTS 6,838,301 B2 * 1/2005 Zheng et al. .................. 438/48
2006/0237746 A1 * 10/2006 Orlowski et al. ........... 257/192

* cited by examiner

*Primary Examiner*—Cuong Nguyen
(74) *Attorney, Agent, or Firm*—Law Office at Gerald Maliszewski; Gerald Maliszewski

(57) ABSTRACT

A floating body germanium (Ge) phototransistor with a photo absorption threshold bias region, and an associated fabrication process are presented. The method includes: providing a p-doped Silicon (Si) substrate; selectively forming an insulator layer overlying a first surface of the Si substrate; forming an epitaxial Ge layer overlying the insulator layer; forming a channel region in the Ge layer; forming a gate dielectric, gate electrode, and gate spacers; forming source/drain (S/D) regions in the Ge layer; and, forming a photo absorption threshold bias region in the Ge layer, adjacent the channel region. In one aspect, the second S/D region has a length, longer than the first S/D length. The photo absorption threshold bias region underlies the second S/D region. Alternately, the second S/D region is separated from the channel by an offset, and the photo absorption threshold bias region is the offset in the Ge layer, after a light p-doping.

13 Claims, 5 Drawing Sheets

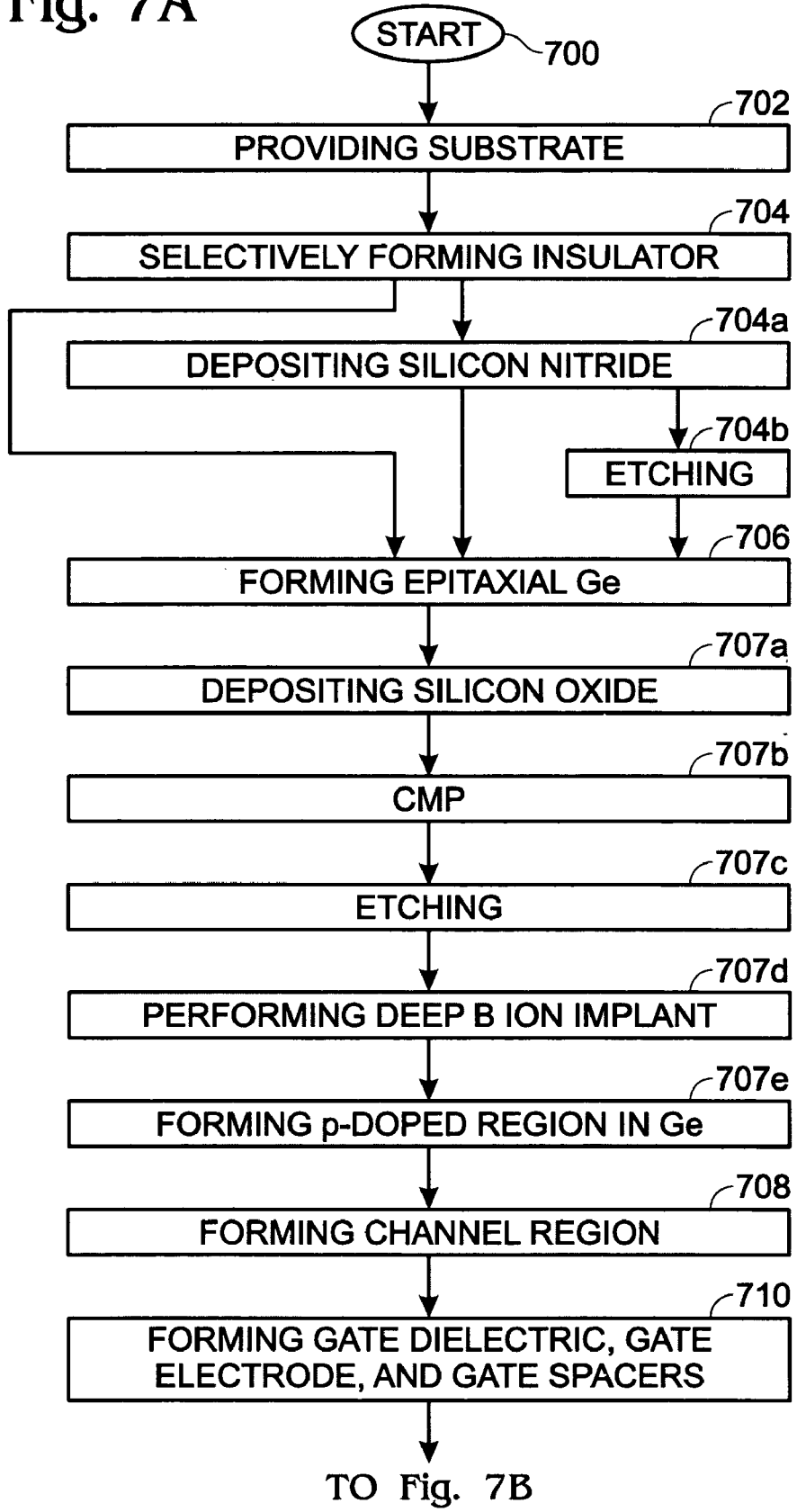

FLOATING BODY GERMANIUM PHOTOTRANSISTOR WITH PHOTO ABSORPTION THRESHOLD BIAS REGION

RELATED APPLICATIONS

This application is a Continuation-in-Part of a pending patent application entitled, FLOATING BODY GERMANIUM PHOTOTRANSISTOR, Lee et al., Ser. No. 11/174,035, filed Jul. 1, 2005. This application claims priority to the above-mentioned parent application under 35 U.S.C. 120, and expressly incorporates the parent application by reference.

BACKGROUND OF THE INVENTION

1. Field of the Invention

This invention generally relates to integrated circuit (IC) fabrication and, more particularly, to a floating body germanium (Ge) phototransistor with a photo absorption threshold bias region, and an associated fabrication process.

2. Description of the Related Art

FIG. 1 is a Cross-Sectional Transmission Electron Microscopy (XTEM) image of an interface between Ge and $Si_3N_4$. The Ge film has been regrown by liquid phase epitaxy. In a co-pending application entitled METHOD OF EPITAXIAL GROWTH OF GERMANIUM PHOTODETECTOR FOR CMOS IMAGER, Lee et al., Ser. No. 11/069,424, filed Feb. 28, 2005, a method for growing single crystalline Ge film by liquid phase epitaxy is presented, along with a means of fabricating a PIN photo detector for infrared photon detection. However, it is noted that the interface between Ge single crystal and the bottom dielectric layer ($Si_3N_4$) is not perfect, as shown in the TEM image. This interface may potentially cause leakage current in the diode. This interface is likely the result of the Ge PIN diode using the entire Ge film, so that the bottom interface deteriorates the electrical performance.

It is advantageous that a thicker germanium film be used for the transistor fabrication, so that the drain depletion region does not contact the high defect region of the germanium that is adjacent to the insulator interface. To address the floating body issue, the source electrode can be extended through the full thickness of germanium thin film, extending to the silicon substrate. The source can also be extended through the high defect density germanium, to insulator interface. However, with this structure the source junction leakage current is relatively high. As a result, the floating substrate effect of the transistor is diminished.

SUMMARY OF THE INVENTION

The present invention provides an improvement to the floating body effect of a Ge phototransistor, and in one aspect, provides an offset drain to enhance the phototransistor efficiency. The germanium thin film at the germanium-to-silicon nitride contact region is moderately doped and a shallow source junction is used to minimize source junction leakage current. In a separate aspect, the drain diffusion region is offset from gate to provide additional germanium volume for photo absorption. The offset drain is important for a very short channel device where the total effective light absorption area is very small.

Accordingly, a method is provided for fabrication a floating body Ge phototransistor with a photo absorption threshold bias region. The method comprises: providing a p-doped silicon (Si) substrate; selectively forming an insulator layer overlying a first surface of the Si substrate; forming an epitaxial Ge layer overlying the insulator layer; forming a channel region in the Ge layer; forming a gate dielectric, gate electrode, and gate spacers overlying the channel region; forming source/drain (S/D) regions in the Ge layer; and, forming a photo absorption threshold bias region in the Ge layer, adjacent the channel region.

In one aspect, selectively forming the insulator layer overlying a first surface of the Si substrate includes: depositing silicon nitride with a top surface overlying the Si substrate; and, after forming the epitaxial Ge layer, selectively etching the Ge layer encapsulating material, the Ge layer, and the Si nitride, exposing a Si substrate second surface. Then, the method further comprises: depositing silicon oxide overlying the Si substrate second surface; chemical-mechanical polishing (CMP) the silicon oxide to the level of the Ge layer encapsulating material; and, etching to remove the Ge layer encapsulating material.

In another aspect, the method further comprises: performing a deep Boron ion implant; and, forming a p-doped region in the Ge layer, immediately overlying the silicon nitride top surface.

The first S/D region is formed approximately overlying the Si substrate second surface, and has a first length. The second S/D region has a second length, longer than the first length. The photo absorption threshold bias region underlies the second S/D region. Alternately, the second S/D region is separated from the channel by an offset, and the photo absorption threshold bias region is created by p-doped the offset in the Ge layer.

Additional details of the above-described method and floating body Ge phototransistor with a photo absorption threshold bias region are provided below.

BRIEF DESCRIPTION OF THE DRAWINGS

FIGS. 7A and 7B are flowcharts illustrating a method for fabrication a floating body Ge phototransistor with a photo absorption threshold bias region.

DETAILED DESCRIPTION

Figure 1:
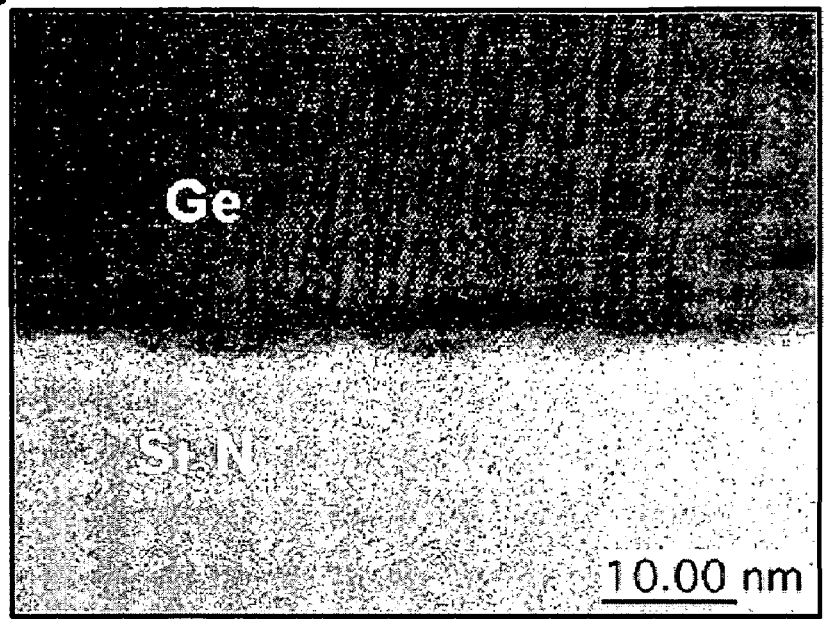
FIG. 1 is a Cross-Sectional Transmission Electron Microscopy (XTEM) image of an interface between Ge and $Si_3N_4$.
Figure 2:
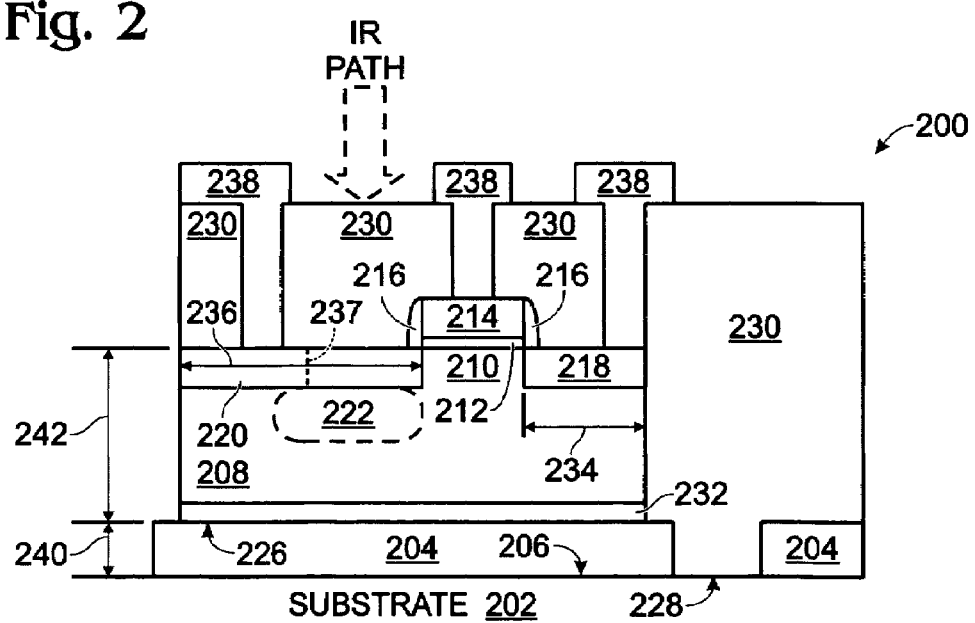
FIG. 2 is a partial cross-sectional view of a floating body germanium (Ge) phototransistor with a photo absorption threshold bias region.

FIG. 2 is a partial cross-sectional view of a floating body germanium (Ge) phototransistor with a photo absorption threshold bias region. The phototransistor 200 comprises a p-doped silicon (Si) substrate 202, and an insulator layer 204 overlying a first surface 206 of the Si substrate 202. An epitaxial Ge layer 208 overlies the insulator layer 204. Phototransistor 200 does not require LDD regions, therefore, no LDD regions are shown in the figure. In other aspects (not shown), phototransistor 200 may be fabricated with optional LDD regions. For example, phototransistor 200 may include LDD regions if peripheral circuitry transistors (not shown) are fabricated with LDD regions.

A channel region 210 is formed in the Ge layer 208. A gate dielectric 212, gate electrode 214, and gate spacers 216 overlie the channel region 210. A first source/drain (S/D) region 218 and a second S/D region 220 are also formed in the Ge layer 208. Also shown is a photo absorption threshold bias region 222 in the Ge layer 208, adjacent the channel region 210.

In one aspect, the insulator layer 204 is a silicon nitride layer with a top surface 226. The Si substrate 202 includes a second surface 228 adjacent the first surface 206. Silicon oxide 230 overlies the Si substrate second surface 228. Also shown is a p-doped region 232 in the Ge layer 208, immediately overlying the silicon nitride top surface 226.

The first S/D region 218 approximately overlies the Si substrate second surface 228 and has a first length 234. More specifically, the substrate second surface 228 underlies a region of Si oxide adjacent the "outside" edge of the first S/D region 218, where the "outside" edge is the edge of the S/D region furthest from the channel region 210. The second S/D region 220 has a second length 236, longer than the first length 234. The photo absorption threshold bias region 222 in the Ge layer 208 underlies the second S/D region 220. Metal interlevel interconnects 238 are also shown. Alternately stated, the second S/D region 220 has an extension region 237 (between the dotted line and the channel), which makes the second S/D 220 longer than the first S/D 218. In this aspect, the photo absorption threshold bias region 222 underlies the extension 237

Figure 3:
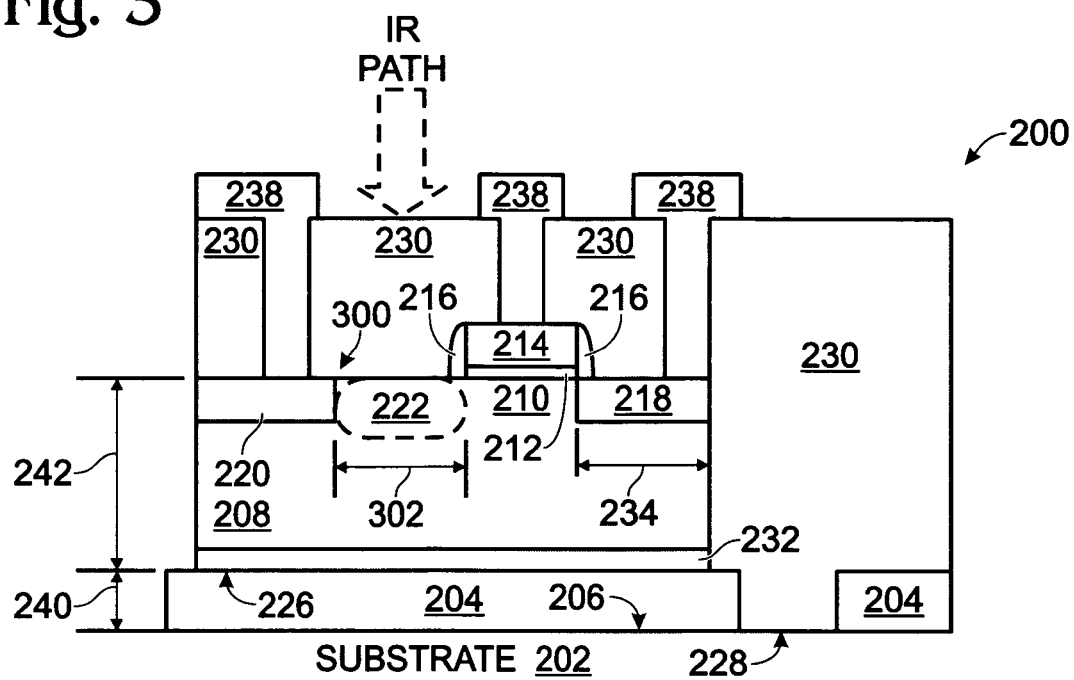
FIG. 3 is a partial cross-sectional view of a floating body Ge phototransistor with a photo absorption threshold bias region and an offset S/D region.

FIG. 3 is a partial cross-sectional view of a floating body Ge phototransistor with a photo absorption threshold bias region and an offset S/D region. As in FIG. 2, the first S/D region 218 approximately overlies the Si substrate second surface 228. More specifically, the substrate second surface 228 underlies a region of Si oxide adjacent the "outside" edge of the first S/D region 218, where the "outside" edge is the edge of the S/D region furthest from the channel region 210.

Also as shown, the channel-side edge 300 of the second S/D region 220, or the edge closest to the channel, is not directly adjacent to the channel region 210, as is conventional. Rather, the channel-side edge 300 is offset from the channel region 210 by a distance 302. The photo absorption threshold bias region 222 in the Ge layer 208 includes a p-doped offset 222 separating the second S/D region 220 from the channel 210. More specifically, the p-offset 222 separates the second S/D edge 300 from the channel region 210.

The maximum offset distance 302 is no larger than d, where d is calculated as follows:

$$d = \sqrt{\frac{2\varepsilon(V_D - V_{DSAT})}{qN}}.$$

Where $\varepsilon$ is the dielectric constant of the germanium, N is the channel doping density, and $V_D$ and $V_{DSAT}$ are the drain bias voltage and the drain saturation voltage at the operational gate bias voltage, respectively. The above-mentioned formula assumes that the second S/D region 220 is a drain.

With respect to either FIG. 2 or 3, the insulator layer 204 overlying the Si substrate 202 has a thickness 240 in the range of about 10 to 500 nm. The epitaxial Ge layer 208 has a thickness 242 in the range of about 300 to 1000 nanometers (nm).

In one aspect, the gate dielectric 212 and gate spacers 216 are formed from wide bandgap materials. The use of wide bandgap materials permits the entry of light (IR) from the "top" direction into the Ge layer 206. Alternately, only some of these regions are made from wide bandgap materials. As another alternative, narrow bandgap materials, and/or a metal gate are used, and IR light enters the Ge layer from the side or bottom directions.

For example, the gate dielectric 212 can be $SiO_2$, $GeO_2$, $Al_2O_3$, $HfO_2$, $ZrO_2$, $TiO_2$, $Ta_2O_5$, or combinations of the above-mentioned materials. The gate electrode 214 can be polycrystalline Ge, polycrystalline SiGe, or polysilicon. The gate spacers 216 can be $SiO_2$ or $Si_3N_4$. However, this is not an exhaustive list of materials. Further, as mentioned above, wide bandgap material need not be used. As used herein, a wide bandgap material has a bandgap of greater than about 1.1 eV, and readily permits the penetration of light with a wavelength between 1 and 1.6 micrometers. This is the wavelength of light is absorbed by Ge. 1.1 eV is the bandgap of Si. PolySiGe and polyGe have slightly narrower bandgaps than 1.1 eV, which permits at least the partial penetration of IR.

FUNCTIONAL DESCRIPTION

Figure 4:
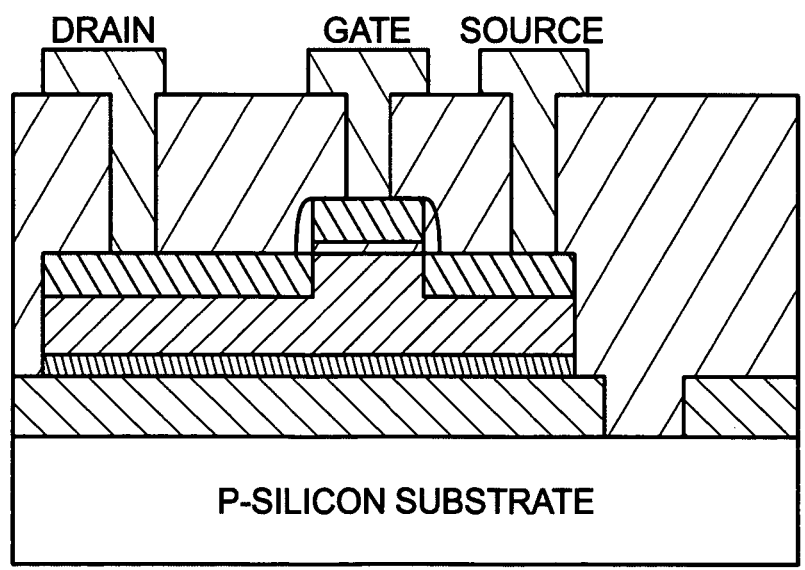
FIG. 4 is another partial cross-sectional view of the phototransistor of FIG. 2.
Figure 4:
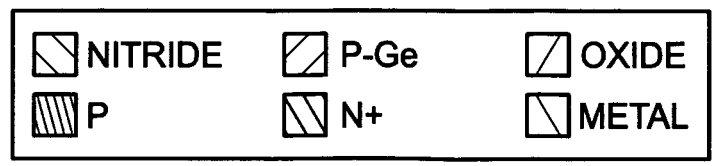

FIG. 4 is another partial cross-sectional view of the phototransistor of FIG. 2. The germanium phototransistor is fabricated on a p-type silicon substrate, or the p-well of a silicon integrated circuit substrate. The germanium at the nitride interface is moderately doped with boron. Both source and drain junctions are very shallow to avoid the depletion region reaching the high defect density at the germanium-to-nitride interface region. The detail structure and the operation of the device are apparent form the description of the fabrication process.

The device fabrication process is as follows:

1. Follow any desirable state-of-the-art silicon integration process to fabricate silicon CMOS for supporting electronics circuit. Save a p-substrate or p-well region for germanium phototransistor fabrication.

2. Fabricate liquid phase epitaxy (LPE) germanium thin film over a silicon nitride, which has been formed on the silicon substrate. The thickness of germanium is typically no thinner than about 300 mm. Do not remove the top cover oxide.

3. Photoresist and etch the top cover oxide and germanium.

4. Deposit oxide. The oxide thickness is about 1 to 1.5 times as thick as the sum of the germanium and the cover oxide thicknesses.

Figure 5:
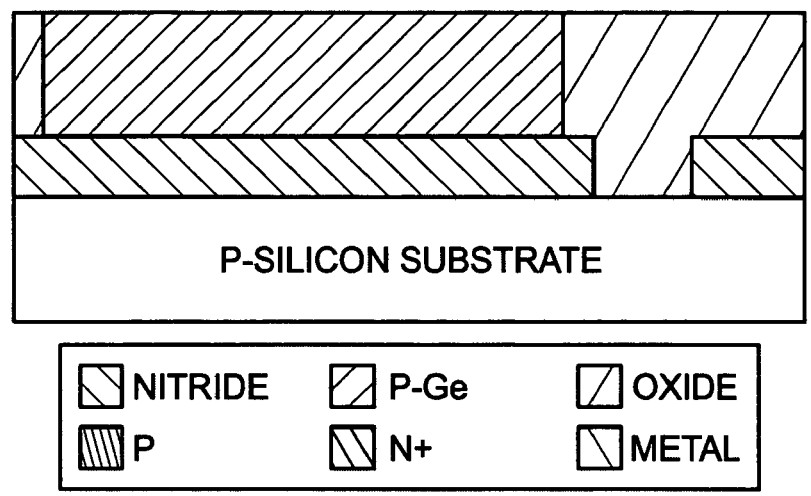
FIG. 5 depicts additional steps in the fabrication of the phototransistor of FIG. 2.

FIG. 5 depicts additional steps in the fabrication of the phototransistor of FIG. 2.

5. CMP planarized the wafer. Do not completely remove the cover oxide. Wet etch to remove the remaining cover oxide.

6. Boron ion implant to dope the germanium film for threshold voltage adjustment, and deep boron ion implant to dope germanium at nitride interface p-doped region.

7. Use conventional processes to deposit gate oxide, form a gate electrode, and shallow source/drain arsenic ion implant. Oxide passivation and metallization steps occur next.

Since the depletion region of the source junction does not extended to the defect region at the bottom of the germanium layer near the silicon nitride, the leakage current at the source junction is small. The photo-generated holes can accumulated in the germanium film and effectively bias the germanium film to reduce the threshold voltage of the germanium phototransistor. Hence, the output current is increased. Near the silicon nitride, the germanium thin film is p-doped, which reduces the generation current and also prevents the drain depression region from reaching the silicon nitride interface.

Figure 6:
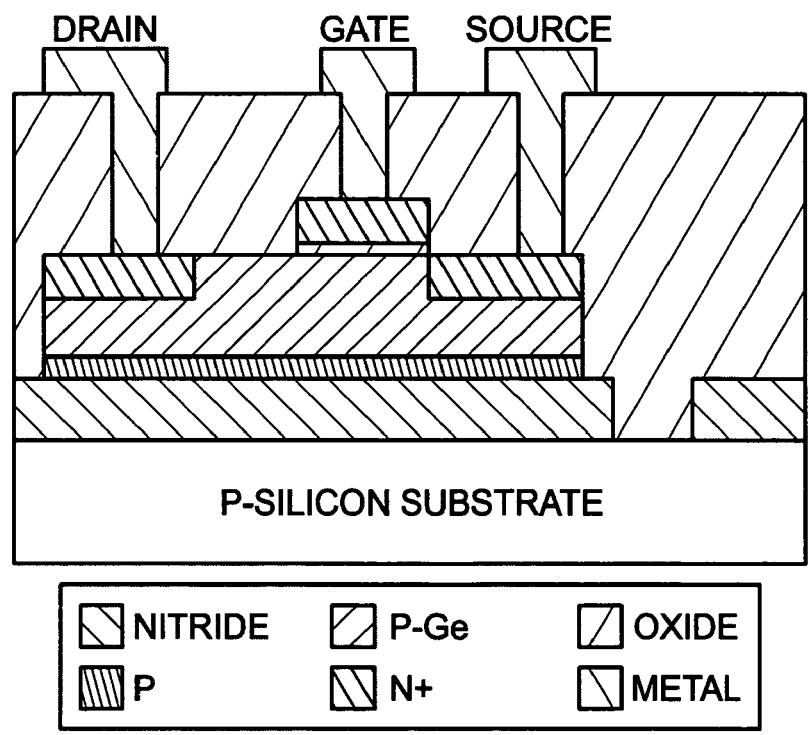
FIG. 6 is another partial cross-sectional view of the phototransistor of FIG. 3.

FIG. 6 is another partial cross-sectional view of the phototransistor of FIG. 3. In an alternative aspect, the phototransistor drain junction is offset from the drain edge. This aspect is useful for very short channel transistors, where the active photo detector area is very small. The offset region is lightly p-doped. In this aspect, the transistor does not need a conventional LDD structure. The fabrication of the offset drain aspect of the phototransistor can be identical to the phototransistor of FIGS. 2 and 4, except that a photoresist process is required to mask the offset drain region during drain ion implantation.

The maximum off set distance is no larger than d, where $$d = \sqrt{\frac{2\varepsilon(V_D - V_{DSAT})}{qN}}.$$

Where $\varepsilon$ is the dielectric constant of the germanium, N is the channel doping density, and $V_D$ and $V_{DSAT}$ are the drain bias voltage and the drain saturation voltage at the operational gate bias voltage, respectively. When the transistor is selected, and both the gate and drain are properly biased, the drain offset region (photo absorption threshold bias region) is completely depleted in the presence of light. Therefore, the offset does not degrade drain current. When there is no light on this selected transistor, the offset region is not completely depleted. The drain current is small and, therefore, the light on/off drain current ratio is very large.

This invention describes a Ge MOSFET device on an insulator structure that takes advantage of the floating body effect for improved amplification of a photodetector signal. The Ge epitaxial film is formed by liquid phase epitaxial regrowth. However, the floating body effect associated with this Ge MOS phototransistor is also applicable to any device fabricated on germanium-on-insulator (GeOI) wafers.

The floating body model for an SOI device depicts a body that is capacitively coupled, through separate capacitors, to the gate, drain, source, and substrate. A more complex model envisions a parasitic bipolar transistor with a base connected to the body, an emitter and collector connected to the source and drain, and a parallel connected back transistor with a gate connected to the substrate.

The Ge deposition method can be CVD (chemical vapor deposition), PVD (physical vapor deposition), MBE (Molecule Beam Epitaxy), or any other suitable thin film deposition method. Next, the Ge film is patterned and etched into desired features. These features must include a small area of Ge directly on top of the Si substrate. This area works as a seed window for the Ge epitaxial process. Then, a conformal dielectric layer (20 nm to 1000 nm) is deposited to encapsulate the Ge film. Rapid thermal annealing (RTA) is used to heat up the wafer and melt the Ge film. For example, silicon oxide or silicon nitride can be used as the dielectric layer. The melting temperature for crystalline Ge is 938° C., so the RTA temperature is between 920° C. to 1000° C. During this anneal, the Ge film melts, and the dielectric insulators encapsulating the Ge act as microcrucibles, keeping the Ge liquid from flowing randomly. The Si substrate, the underlying insulator and overlying dielectric remain solid. The wafer is then cooled down naturally. While the Ge liquid is cooling down, liquid phase epitaxy (LPE) occurs, with the growth front starting from the Si/Ge interface in the seeding windows, propagating laterally. Finally, single crystalline Ge is formed with defects concentrated and terminated at the seeding window.

Figure 7B:
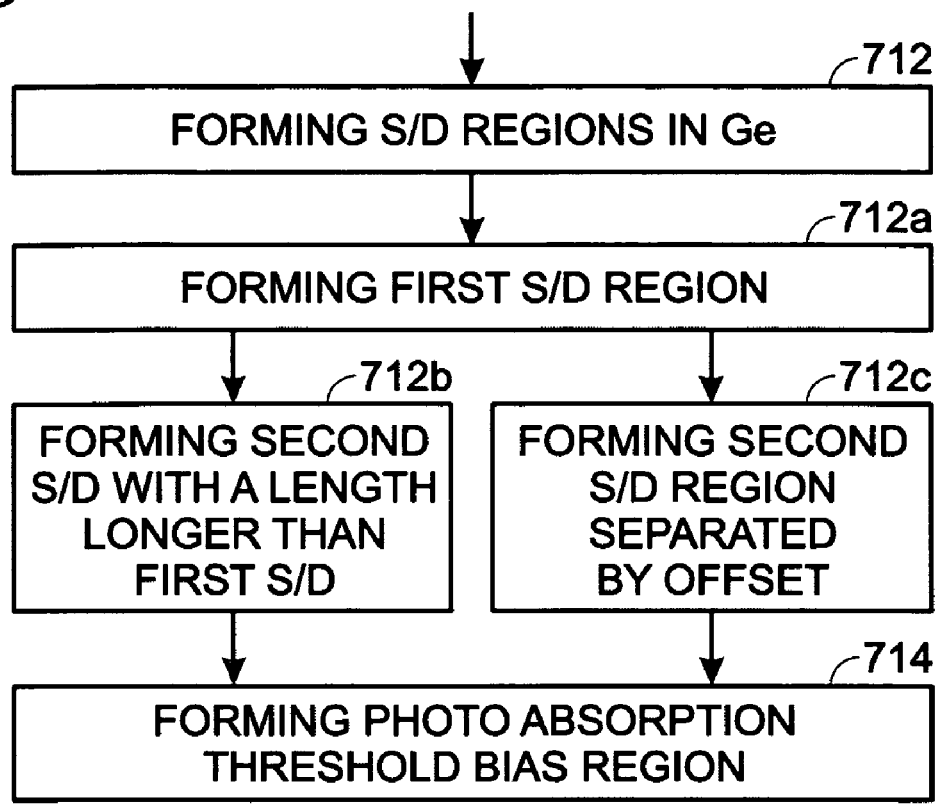

FIGS. 7A and 7B are flowcharts illustrating a method for fabrication a floating body Ge phototransistor with a photo absorption threshold bias region. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 700.

Step 702 provides a p-doped Si substrate. Step 704 selectively forms an insulator layer overlying a first surface of the Si substrate. In one aspect, the insulator layer has a thickness in the range of about 10 to 500 nm. Step 706 forms an epitaxial Ge layer overlying the insulator layer. Step 708 forms a channel region in the Ge layer. Step 710 forms a gate dielectric, gate electrode, and gate spacers overlying the channel region. Step 712 forms source/drain (S/D) regions in the Ge layer. Step 714 forms a photo absorption threshold bias region in the Ge layer, adjacent the channel region.

In one aspect, forming the epitaxial Ge layer overlying the insulator layer in Step 706 includes performing a liquid phase epitaxy (LPE) process on deposited Ge. For example, Step 706 may include the following substeps (not shown). Step 706*a* deposits Ge to a thickness in the range of about 300 to 1000 nm. For example, Ge can be deposited using a CVD, PVD, or MBE process. Step 706*b* encapsulates the Ge with a Ge barrier material having a melting temperature greater than the Ge melting temperature. Typically, the Ge barrier material is a material that does not chemically interact with Ge. Then, Step 706*c* melts the Ge using a temperature less than the Ge barrier material melting temperature. For example, Step 706*c* may heat the Si substrate to a temperature in the range of about 920 and 1000° C., for a time duration in the range of about 0 to 10 seconds. A "zero" second duration means that the substrate is allowed to cool immediately upon attaining the target temperature.

In another aspect, selectively forming the insulator layer overlying a first surface of the Si substrate in Step 704 includes substeps. Step 704*a* deposits silicon nitride with a top surface overlying the Si substrate. Step 704*b* is performed after forming the epitaxial Ge layer in Step 706. Step 704*b* selectively etches the Ge layer encapsulating material, the Ge layer, and the Si nitride, exposing a Si substrate second surface. Then, Step 707*a* deposits silicon oxide overlying the Si substrate second surface. Step 707*b* chemical-mechanical polishes (CMP) the silicon oxide to the level of the Ge layer encapsulating material. Step 707*c* etches to remove the Ge layer encapsulating material.

In another aspect, Step 707*d* performs a deep Boron (B) ion implant, and Step 707*e* forms a p-doped region in the Ge layer, immediately overlying the silicon nitride top surface (as a result of Step 707*d*).

In one aspect, forming S/D regions in the Ge layer in Step 712 includes substeps. Step 712*a* forms a first S/D region approximately overlying the Si substrate second surface, having a first length. Step 712*b* forms a second S/D region having a second length, longer than the first length. Then, forming the photo absorption threshold bias region in the Ge layer (Step 714) includes forming the photo absorption threshold bias region underlying the second S/D region.

As an alternative to Step 712*b*, Step 712*c* forms a second S/D region, separated from the channel by an offset. Then, Step 714 p-dopes the offset in the Ge layer.

In one aspect, forming the gate dielectric and gate spacers in Step 710 includes forming the gate dielectric and gate spacers from wide bandgap materials. For example, the gate dielectric can be $SiO_2$, $GeO_2$, $Al_2O_3$, $HfO_2$, $ZrO_2$, $TiO_2$, $Ta_2O_5$, or combinations of the above-mentioned materials. The gate electrode can be polycrystalline Ge, polycrystalline SiGe, or polysilicon. The gate spacers can be $SiO_2$ or $Si_3N_4$.

An epitaxial Ge phototransistor with a photo absorption threshold bias region, and an associated fabrication method has been presented. Specific process steps and materials have been used as examples to illustrate the invention. However, the invention is not limited to merely these examples. Other variations and embodiments of the invention will occur to those skilled in the art.

We claim:

1. A method for fabrication a floating body Germanium (Ge) phototransistor with a photo absorption threshold bias region, the method comprising:
   providing a p-doped Silicon (Si) substrate;
   selectively forming an insulator layer overlying a first surface of the Si substrate;
   forming an epitaxial Ge layer overlying the insulator layer;
   forming a channel region in the Ge layer;
   forming a gate dielectric, gate electrode, and gate spacers overlying the channel region;
   forming source/drain (S/D) regions in the Ge layer; and,
   forming a photo absorption threshold bias region in the Ge layer, adjacent the channel region.

2. The method of claim 1 wherein forming the epitaxial Ge layer overlying the insulator layer includes performing a liquid phase epitaxy (LPE) process on deposited Ge.

3. The method of claim 2 wherein depositing Ge overlying the insulator layer includes depositing Ge to a thickness in the range of about 300 to 1000 nanometers (nm).

4. The method of claim 2 wherein performing the LPE process on deposited Ge includes:
   encapsulating the Ge with a Ge barrier material having a melting temperature greater than the Ge melting temperature; and,
   melting the Ge using a temperature less than the Ge barrier material melting temperature.

5. The method of claim 1 wherein selectively forming the insulator layer overlying a first surface of the Si substrate includes:
   depositing silicon nitride with a top surface overlying the Si substrate;
   after forming the epitaxial Ge layer, selectively etching the Ge layer encapsulating material, the Ge layer, and the Si nitride, exposing a Si substrate second surface; and,
   the method further comprising:
   depositing silicon oxide overlying the Si substrate second surface;
   chemical-mechanical polishing (CMP) the silicon oxide to the level of the Ge layer encapsulating material; and,
   etching to remove the Ge layer encapsulating material.

6. The method of claim 5 further comprising:
   performing a deep Boron ion implant; and,
   forming a p-doped region in the Ge layer, immediately overlying the silicon nitride top surface.

7. The method of claim 5 wherein forming S/D regions in the Ge layer includes:
   forming a first S/D region approximately overlying the Si substrate second surface, having a first length; and,
   forming a second S/D region having a second length, longer than the first length; and,
   wherein forming the photo absorption threshold bias region in the Ge layer includes forming the photo absorption threshold bias region underlying the second S/D region.

8. The method of claim 5 wherein forming S/D regions in the Ge layer includes:
   forming a first S/D region approximately overlying the Si substrate second surface; and,
   forming a second S/D region, separated from the channel by an offset; and,
   wherein forming the photo absorption threshold bias region in the Ge layer includes p-doping the offset in the Ge layer.

9. The method of claim 3 wherein depositing Ge overlying the insulator layer and the Si substrate second surface includes depositing Ge using a process selected from the group consisting of chemical vapor deposition (CVD), physical vapor deposition (PVD), and molecular beam epitaxy (MBE).

10. The method of claim 3 wherein melting the Ge includes heating the Si substrate to a temperature in the range of about 920 and 1000° C., for a time duration in the range of about 0 to 10 seconds.

11. The method of claim 1 wherein selectively forming the insulator layer overlying the Si substrate includes forming an insulator layer having a thickness in the range of about 10 to 500 nm.

12. The method of claim 1 wherein forming the gate dielectric, gate electrode, and gate spacers overlying the channel region includes forming the gate dielectric and gate spacers from wide bandgap materials.

13. The method of claim 12 wherein forming a gate dielectric, gate electrode, and gate spacers overlying the channel region includes:
   forming a gate dielectric overlying the channel, from a material selected from the group consisting of $SiO_2$, $GeO_2$, $Al_2O_3$, $HfO_2$, $ZrO_2$, $TiO_2$, $Ta_2O_5$, and combinations of the above-mentioned materials;
   forming a gate electrode from a material selected from the group consisting of polycrystalline Ge, polycrystalline SiGe, and polysilicon; and,
   forming gate spacers adjacent the gate electrode from a material selected from the group consisting of $SiO_2$ and $Si_3N_4$.

* * * * *